(12) United States Patent
Lin et al.

(10) Patent No.: US 10,756,243 B1
(45) Date of Patent: Aug. 25, 2020

(54) LIGHT-EMITTING DIODE PACKAGE STRUCTURE AND METHOD FOR MANUFACTURING THE SAME

(71) Applicant: Chung Yuan Christian University, Taoyuan (TW)

(72) Inventors: Cheng-An Lin, Taoyuan (TW); Yeeu-Chang Lee, Taoyuan (TW); Cheng-Yi Huang, Taoyuan (TW); Chi-An Chen, Taoyuan (TW); Yi-Tang Sun, Taoyuan (TW)

(73) Assignee: CHUNG YUAN CHRISTIAN UNIVERSITY, Taoyuan (TW)

( * ) Notice: Subject to any disclaimer, the term of this patent is extended or adjusted under 35 U.S.C. 154(b) by 0 days.

(21) Appl. No.: 16/291,174

(22) Filed: Mar. 4, 2019

(51) Int. Cl.
*H01L 33/50* (2010.01)
*H01L 33/56* (2010.01)
(Continued)

(52) U.S. Cl.
CPC .......... *H01L 33/504* (2013.01); *C09K 11/025* (2013.01); *H01L 33/32* (2013.01); *H01L 33/56* (2013.01); *H01L 33/62* (2013.01); *H01L 2933/005* (2013.01); *H01L 2933/0041* (2013.01); *H01L 2933/0066* (2013.01); *Y10S 977/731* (2013.01); *Y10S 977/81* (2013.01); *Y10S 977/83* (2013.01)

(58) Field of Classification Search
CPC . C09K 11/02–025; C09K 11/08; C09K 11/58; C09K 11/582; C09K 2211/1007; A61K 49/0013; A61K 49/0017; A61K 49/223; Y10S 977/731; Y10S 977/81; Y10S 977/83; C07K 7/06; C07K 7/08; B82Y 15/00; B82Y 30/00
See application file for complete search history.

(56) References Cited

U.S. PATENT DOCUMENTS

| 6,066,861 A * | 5/2000 | Hohn ................. C09K 11/7718 252/301.36 |
| 7,208,322 B2 * | 4/2007 | Stolowitz ............... B82Y 15/00 435/6.12 |

(Continued)

OTHER PUBLICATIONS

"Synthesis and Optical Properties of a Dithiolate/Phosphine Protected Au28 Nanocluster", Maha A. Aljuhani, Megalamane S. Bootharaju, Lutfan Sinatra, Jean-Marie Basset, Omar F. Mohammad, and Osman M. Bakr, KAUST, Saudi Arabia, American Chemical Society, (Year: 2016).*

*Primary Examiner* — Maliheh Malek

(57) ABSTRACT

Disclosed herein are a light-emitting diode (LED) package structure and a method producing the same. The LED package structure includes a substrate; and a light-emitting unit disposed on the substrate. The light-emitting unit comprises a gallium nitride-based semiconductor, and a polymeric layer encapsulating the gallium nitride-based semiconductor. Also disclosed herein is a method of producing the LED package structure. The method comprises: providing a substrate; electrically connecting a gallium nitride-based semiconductor onto the substrate; overlaying the gallium nitride-based semiconductor with a slurry comprising a resin and a plurality of composite fluorescent gold nanocluster; and curing the slurry overlaid on the gallium nitride-based semiconductor to form a solidified polymeric layer.

10 Claims, 9 Drawing Sheets

(51) Int. Cl.
    *H01L 33/62*           (2010.01)
    *H01L 33/32*           (2010.01)
    *C09K 11/02*          (2006.01)

(56) References Cited

U.S. PATENT DOCUMENTS

| | | | |
|---|---|---|---|
| 7,914,588 B2* | 3/2011 | Martinez | C07K 7/06 424/9.34 |
| 8,162,498 B2* | 4/2012 | Ramer | F21V 14/003 362/231 |
| 8,263,668 B2* | 9/2012 | Chang | B82Y 15/00 516/33 |
| 8,957,401 B2* | 2/2015 | Pickett | C09K 11/02 257/13 |
| 9,101,672 B2* | 8/2015 | Yeh | A61K 47/6923 |
| 9,140,415 B2* | 9/2015 | Van Bommel | B82Y 30/00 |
| 9,187,318 B2* | 11/2015 | Duan | B23K 26/0613 |
| 9,302,116 B2* | 4/2016 | Vo-Dinh | A61B 5/4848 |
| 9,349,921 B2* | 5/2016 | Tchoul | G02B 1/04 |
| 9,362,189 B2* | 6/2016 | Jun | H01L 33/505 |
| 9,382,470 B2* | 7/2016 | Kang | C09K 11/703 |
| 9,443,998 B2* | 9/2016 | Werner | H01L 33/56 |
| 9,506,864 B2* | 11/2016 | Chen | C09K 11/06 |
| 9,525,110 B2* | 12/2016 | Kobayashi | C09K 11/0883 |
| 9,784,419 B2* | 10/2017 | Ivan | C09K 11/06 |
| 10,066,158 B2* | 9/2018 | Naasani | H01L 33/505 |
| 10,202,543 B2* | 2/2019 | Masson | C09K 11/025 |
| 10,217,908 B2* | 2/2019 | Naasani | H01L 33/06 |
| 10,573,792 B2* | 2/2020 | Sato | H01L 33/505 |
| 2002/0146742 A1* | 10/2002 | Wybourne | B05D 1/185 435/7.1 |
| 2003/0109056 A1* | 6/2003 | Vossmeyer | G01N 21/77 436/169 |
| 2003/0118729 A1* | 6/2003 | Bishop | B82Y 30/00 427/256 |
| 2004/0002089 A1* | 1/2004 | Dubertret | B82Y 15/00 435/6.12 |
| 2004/0018633 A1* | 1/2004 | Foos | B22F 1/0018 436/166 |
| 2004/0150268 A1* | 8/2004 | Garito | B82Y 5/00 385/50 |
| 2005/0064204 A1* | 3/2005 | Lalli | B82Y 30/00 428/428 |
| 2005/0191448 A1* | 9/2005 | Suh | B41M 5/38207 428/32.69 |
| 2005/0219542 A1* | 10/2005 | Adams | B82Y 15/00 356/445 |
| 2006/0148104 A1* | 7/2006 | Marini | B82Y 5/00 436/524 |
| 2006/0154380 A1* | 7/2006 | Egusa | B22F 1/0018 438/1 |
| 2006/0158097 A1* | 7/2006 | Juestel | C09K 11/7774 313/503 |
| 2007/0069199 A1* | 3/2007 | Choulis | B82Y 20/00 257/40 |
| 2007/0186846 A1* | 8/2007 | Yong | B82Y 30/00 117/41 |
| 2007/0278930 A1* | 12/2007 | Takahashi | H05B 33/14 313/485 |
| 2008/0206562 A1* | 8/2008 | Stucky | B01J 13/02 428/403 |
| 2008/0241262 A1* | 10/2008 | Lee | A61K 9/0009 424/490 |
| 2008/0261044 A1* | 10/2008 | Lalli | E21B 17/003 428/402 |
| 2008/0311488 A1* | 12/2008 | Su | B22F 1/0096 430/7 |
| 2009/0035575 A1* | 2/2009 | Tsai | B22F 9/24 428/402 |
| 2009/0050856 A1* | 2/2009 | Kosowsky | B82Y 10/00 252/502 |
| 2009/0062197 A1* | 3/2009 | Wolf | B82Y 30/00 514/1.1 |
| 2009/0091237 A1* | 4/2009 | Hirosaki | C09K 11/7734 313/495 |
| 2009/0298115 A1* | 12/2009 | Chang | G01N 33/533 435/29 |
| 2010/0009427 A1* | 1/2010 | Martinez | C07K 7/06 435/235.1 |
| 2010/0090176 A1* | 4/2010 | Kosowsky | H05K 1/0257 252/511 |
| 2010/0123155 A1* | 5/2010 | Pickett | B82Y 15/00 257/98 |
| 2010/0128275 A1* | 5/2010 | Chau | B82Y 15/00 356/445 |
| 2010/0140673 A1* | 6/2010 | Daniel | H05K 1/0221 257/288 |
| 2010/0163806 A1* | 7/2010 | Chang | B82Y 15/00 252/408.1 |
| 2011/0021970 A1* | 1/2011 | Vo-Dinh | A61B 5/0071 604/20 |
| 2011/0068321 A1* | 3/2011 | Pickett | C09K 11/025 257/13 |
| 2011/0068322 A1* | 3/2011 | Pickett | C09K 11/02 257/13 |
| 2011/0165689 A1* | 7/2011 | Ying | B82Y 5/00 436/81 |
| 2011/0185854 A1* | 8/2011 | Martinez | C07K 7/06 75/371 |
| 2011/0294995 A1* | 12/2011 | Huo | B82Y 30/00 536/23.1 |
| 2011/0300532 A1* | 12/2011 | Jahnen-Dechent | A61K 49/0423 435/6.1 |
| 2012/0052513 A1* | 3/2012 | Thalappil | A61K 49/0017 435/7.23 |
| 2012/0100075 A1* | 4/2012 | Chang | G01N 33/533 424/9.1 |
| 2012/0195833 A1* | 8/2012 | Lin | A61K 49/223 424/9.1 |
| 2013/0045877 A1* | 2/2013 | Yap | G01N 33/54346 506/7 |
| 2013/0052270 A1* | 2/2013 | Yeh | A61K 47/6923 424/498 |
| 2013/0071619 A1* | 3/2013 | Kajikawa | B82Y 15/00 428/148 |
| 2013/0157055 A1* | 6/2013 | Jenneskens | B22F 1/0018 428/403 |
| 2013/0273340 A1* | 10/2013 | Neretina | B05D 1/32 428/212 |
| 2014/0231749 A1* | 8/2014 | Lee | B22F 1/0018 257/14 |
| 2014/0360981 A1* | 12/2014 | Lin | A61K 49/223 216/83 |
| 2014/0369024 A1* | 12/2014 | Xu | C08F 2/44 362/84 |
| 2015/0037585 A1* | 2/2015 | Compel | G01N 33/54346 428/402 |
| 2015/0075069 A1* | 3/2015 | Ichihashi | F21V 9/14 47/17 |
| 2015/0300578 A1* | 10/2015 | Ivan | C09K 11/06 362/84 |
| 2015/0306253 A1* | 10/2015 | Zheng | A61K 49/0065 424/9.6 |
| 2016/0104825 A1* | 4/2016 | Sato | H01L 33/505 257/98 |
| 2016/0131582 A1* | 5/2016 | Chen | C09K 11/06 436/120 |
| 2016/0271694 A1* | 9/2016 | Weitekamp | B22F 1/0096 |
| 2016/0272865 A1* | 9/2016 | Chung | C09K 5/14 |
| 2017/0176272 A1* | 6/2017 | Yin | B82Y 30/00 |
| 2017/0362282 A1* | 12/2017 | Snow | C07K 14/005 |
| 2018/0055083 A1* | 3/2018 | Chang | C09K 11/025 |
| 2019/0072245 A1* | 3/2019 | Kobayashi | F21V 7/30 |
| 2019/0352562 A1* | 11/2019 | Lin | C09K 11/025 |
| 2020/0086264 A1* | 3/2020 | Chang | B01D 53/007 |
| 2020/0168774 A1* | 5/2020 | Jiang | H01L 33/501 |

* cited by examiner

LIGHT-EMITTING DIODE PACKAGE STRUCTURE AND METHOD FOR MANUFACTURING THE SAME

BACKGROUND OF THE INVENTION

1. Field of the Invention

The present disclosure in general relates to the field of light-emitting diode (LED) devices. More particularly, the present disclosure relates to an LED package structure, which comprises a plurality of composite fluorescent gold nanoclusters serving as wavelength-convertible materials.

2. Description of Related Art

White light-emitting diodes (white LEDs) are a relatively recent innovation resulted from a decade search of an improved LED useful for various displaying devices. In general, white LEDs are constructed using wavelength-convertible materials, which can absorb radiation emitted from the LED and re-emit radiation in a different wavelength (i.e., color). U.S. Pat. No. 5,998,925 teaches white LEDs comprising one or more phosphor materials capable of converting the wavelength of its light source to light in another desired color. Typically, an LED chip or die emits blue light, in which a portion of the blue light is absorbed by phosphors that re-emit yellow light or any combination of green, red and yellow lights. In the meantime, the portion of the blue light not absorbed by the phosphors may be combined with the light emitted from the phosphors thereby gives a nearly white light in the human eyes.

Nevertheless, the wavelength-convertible materials in white LEDs—often are phosphors of transition-metal or rare-metal—are not only expensive, but are also potential environmental hazards. In addition, the correlated color temperature (CCT) of a white light-emitting device often varies across the surface of the device due to the non-uniformity accumulation and/or distribution of the phosphor materials across the LED chip, therefore deteriorates the light extraction efficiency and produces undesirable color rendering property for light emitting devices.

In view of the foregoing, there exists in the related art a need for an improved white LED and a method producing the same by utilizing a novel material to convert wavelengths.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

As embodied and broadly described herein, the present disclosure aims to provide an improved white light-emitting diode (LED) package structure, and a method for manufacturing the same by employing gold nanoclusters as a wavelength-convertible material, so that the thus produced LED can emit a desired wavelength with a desired CCT.

In one aspect, the present disclosure is directed to a LED package structure. According to various embodiments of the present disclosure, the LED package structure comprises a substrate, and a light-emitting unit disposed on the substrate. The light-emitting unit comprises in its structure, a gallium nitride-based semiconductor, and a polymeric layer encapsulating the gallium nitride-based semiconductor. The polymeric layer comprises a resin and at least one composite fluorescent gold nanocluster dispersed therein. Each composite fluorescent gold nanocluster comprises a gold nanocluster, and a capping layer encapsulating at least a portion of the outer surface of the gold nanocluster. The capping layer is composed of a matrix made of a benzene-based compound, and a plurality of phosphine-based compounds distributed across the matrix.

In some optional embodiments, the gallium nitride-based semiconductor is configured to emit a light having a wavelength ranging from 395 nm to 495 nm.

In some optional embodiments, the gallium nitride-based semiconductor is configured to emit a light having a wavelength that is shorter than 395 nm. In such case, the polymeric layer further comprises a plurality of luminescent carbon nanoparticle dispersed in the resin and may respectively emit a light having a wavelength ranging from 400 nm to 500 nm.

According to embodiments of the present disclosure, the benzene-based compound is selected from the group consisting of, benzene, alkylbenzene, halobenzene, phenol, benzoic acid, acetophenone, methyl benzoate, anisole, aniline, nitrobenzene, benzonitrile, benzamide, benzenesulfonic acid, naphthalene, and anthracene. For instance, the alkylbenzene may be toluene, cumene, ethylbenzene, styrene, or xylene; and the halobenzene may be fluorobenzene, chlorobenzene, bromobenzene, or iodobenzene. According to certain examples of the present disclosure, the benzene-based compound is toluene.

According to embodiments of the present disclosure, the plurality of phosphine-based compounds is selected from the group consisting of, phosphine, phosphine oxide, phosphonium, diphosphine, triphosphine, alkyl phosphine, cycloalkyl phosphine, aryl phosphine, aryl phosphine oxide, phenyl phosphine, bidentate phosphine, silicone derivative of phosphine, siloxane or polysilane derivative of phosphine, and olefinic phosphine. In certain examples, the phosphine-based compound is alkyl phosphine, such as trioctylphosphine (TOP). In certain examples, the phosphine-based compound is aryl phosphine oxide, such as trioctylphosphine oxide (TOPO). In alternative examples, the phosphine-based compound is phenyl phosphine, such as triphenylphosphine (TPP).

In another aspect, the present disclosure pertains to a method for producing the LED package structure. The present method comprises: (a) providing a substrate; (b) electrically connecting a gallium-nitride based semiconductor onto the substrate; (c) overlaying the gallium nitride-based semiconductor with a slurry comprising a resin and a plurality of composite fluorescent gold nanoclusters; and (d) curing the slurry overlaid on the gallium-based semiconductor for a sufficient time to form a solidified polymeric layer, thereby creates the LED package structure. In addition, each composite fluorescent gold nanocluster comprises a gold nanocluster, and a capping layer encapsulating at least a portion of an outer surface of the gold nanocluster. The capping layer is composed of a matrix made of a benzene-based compound, and a plurality of phosphine-based compounds distributed across the matrix.

In some optional embodiments, the gallium nitride-based semiconductor is configured to emit a light having a wavelength ranging from 395 nm to 495 nm.

In some optional embodiments, the gallium nitride-based semiconductor is configured to emit a light having a wavelength that is shorter than 395 nm. In these embodiments, the slurry in the step (c) further comprises a plurality of luminescent carbon nanoparticles, which are dispersed in the resin and emit a light of a wavelength ranging from 400 nm to 500 nm.

According to embodiments of the present disclosure, the benzene-based compound is selected from the group consisting of benzene, alkylbenzene, halobenzene, phenol, benzoic acid, acetophenone, methyl benzoate, anisole, aniline, nitrobenzene, benzonitrile, benzamide, benzenesulfonic acid, naphthalene, and anthracene.

Preferably, the alkylbenzene is toluene, cumene, ethylbenzene, styrene, or xylene; and the halobenzene is fluorobenzene, chlorobenzene, bromobenzene, or iodobenzene. According to certain working examples of the present disclosure, the benzene-based compound is toluene.

According to embodiments of the present disclosure, the plurality of phosphine-based compounds is selected from the group consisting of phosphine, phosphine oxide, phosphonium, diphosphine, triphosphine, alkyl phosphine, cycloalkyl phosphine, aryl phosphine, aryl phosphine oxide, phenyl phosphine, bidentate phosphine, silicone derivative of phosphine, siloxane or polysilane derivative of phosphine, and olefinic phosphine. In certain examples, the phosphine-based compound is aryl phosphine oxide, such as trioctylphosphine oxide (TOPO). In certain examples, the phosphine-based compound is alkyl phosphine, such as trioctylphosphine (TOP). Alternatively, the phosphine-based compound is phenyl phosphine, such as triphenylphosphine (TPP).

By virtue of the above configuration, the thus-produced LED package structure comprises a light-emitting unit, which has wavelength-convertible composite fluorescent gold nanoclusters evenly distributed therein. As could be appreciated, the fluorescence intensity and color temperature of the present LED may vary with the concentration and volume of the present composite fluorescent gold nanoclusters.

Furthermore, the present method is characterized in not using any reducing agent(s) in the process of manufacturing the present composite fluorescent gold nanocluster; accordingly, the present LED package structure is free from any toxicity that might be caused by or associated with the reducing agent(s), thereby confers the safety of the present LED package structure.

Many of the attendant features and advantages of the present disclosure will becomes better understood with reference to the following detailed description considered in connection with the accompanying drawings.

BRIEF DESCRIPTION OF THE DRAWINGS

The present description will be better understood from the following detailed description read in light of the accompanying drawings, where.

Figure 1A:
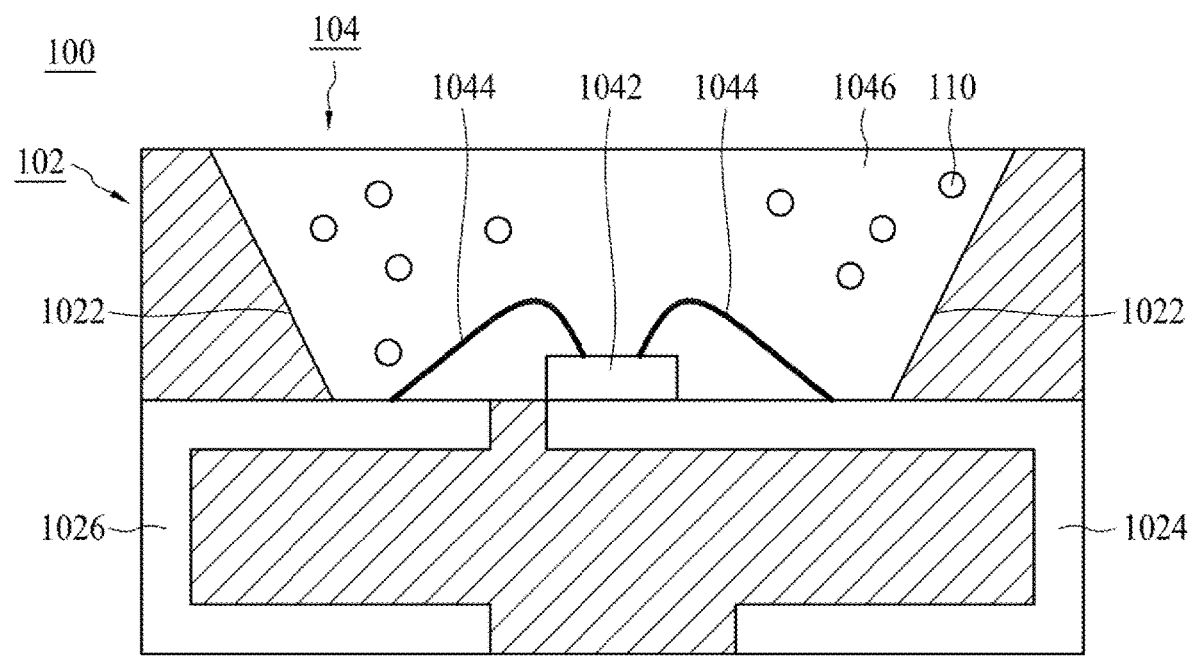
FIG. 1A is a cross-section view of an exemplary LED package structure 100 according to one embodiment of the present disclosure.

In accordance with common practice, the various described features/elements are not drawn to scale but instead are drawn to best illustrate specific features/elements relevant to the present invention. Also, like reference numerals and designations in the various drawings are used to indicate like elements/parts.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

I. Definition

For convenience, certain terms employed in the specification, examples and appended claims are collected here. Unless otherwise defined herein, scientific, and technical terminologies employed in the present disclosure shall have the meanings that are commonly understood and used by one of ordinary skill in the art. Also, unless otherwise required by context, it will be understood that singular terms shall include plural forms of the same and plural terms shall include the singular. Specifically, as used herein and in the claims, the singular forms "a" and "an" include the plural reference unless the context clearly indicates otherwise. Also, as used herein and in the claims, the terms "at least one" and "one or more" have the same meaning and include one, two, three, or more.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about". Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques.

The term "wavelength-convertible" used herein refers to the ability of a certain material to absorb wavelengths of one emission color and convert it to a different wavelength of another emission color, and thereby generate a desired emission color.

The term "nanoclusters" used herein refers to a collection of small numbers (e.g., 2 to hundreds of atoms) of noble metal atoms (e.g., gold or silver atoms) with physical sizes close to the Fermi wavelength of an electron. Generally, nanoclusters (such as gold nanoclusters in the present disclosure) may have diameters in the range of about 0.1 to about 3 nm. Nanoclusters used in the present disclosure are fluorescent gold nanoclusters, which indicates the ability to emit light of a wavelength (emission wavelength) when exposed to light of another wavelength (excitation wavelength).

The term "fluorescence" or "fluorescent," as used herein, refers to a physical phenomenon based upon the ability of certain compounds to absorb and emit light at different wavelengths. The absorption of light (photons) at a first wavelength is followed by the emission of photons at a second wavelength and different energy. As used herein, the term "shift" refers to the shifting of the point of maximum amplitude of one or more peaks in a fluorescence emission profile to a longer wavelength. A shift may occur in any part of the electromagnetic spectrum.

The term "phosphine-based compound" used herein refers to a chemical compound that has at least one phosphine group (e.g., in the form of phosphine, phosphine oxide, phosphonium, or phenylphosphine). The phosphine-based compounds include primary phosphines, secondary phosphines, and tertiary phosphines, as those known to person having ordinary skill in the art. These phosphine-based compounds share same chemical properties, such as an intense penetrating odor and high oxidation ability.

II. Description of the Invention

This invention aims at providing an improved LED with excellent color rendering property and desired color temperature. Further, as yttrium-aluminum-garnet (YAG) fluorescent materials—a main material commonly used in manufacturing wavelength-converting phosphors of LEDs—are cytotoxic and may cause environmental pollution, thus the present invention also aims at providing an improved LED, in which a novel wavelength-convertible material made by gold nanoclusters is employed to address the above issues of YAG fluorescent materials.

Accordingly, the first aspect of the present disclosure is directed to a LED package structure, especially a white LED package structure. References are made to FIGS. 1A and 1B.

Referring to FIG. 1A, which is a cross-section view of an exemplary LED package structure according to one embodiment of the present disclosure. The LED package structure 100 comprises a substrate 102, and a light-emitting unit 104 constructed on the substrate 102. To this purpose, a substrate having pre-deposited layers of materials (e.g., nitride or oxides) commonly used in LED industry (e.g., aluminum oxide substrate and the like) may be used for constructing the present LED package structure. Accordingly, a recessed portion 1022, a positive metal terminal 1024 (serving as a positive electrode), and a negative metal terminal 1026 (serving as a negative electrode) were respectively created on the substrate 102 via any method known in the art (e.g., photoresist etching). A gallium nitride-based semiconductor 1042 having a p-type electrode and an n-type electrode is then disposed in the recessed portion 1022 and on top of the positive metal terminal 1024. The p-type and n-type electrodes (not depicted in FIG. 1A) of the gallium nitride-based semiconductor 1042 are electrically connected to the positive metal terminal 1024 and the negative metal terminal 1026, respectively, by two conductive wires 1044. In some embodiments, the gallium nitride-based semiconductor 1042 may include a material selected from the group consisting of indium gallium nitride (InGaN), gallium nitride (GaN), aluminum gallium nitride (AlGaN), and a combination thereof. It should be noted that the gallium nitride-based semiconductor 1042 illustratively depicted in FIG. 1A is exemplified as a chip type, but is not limited thereto.

Next, a slurry comprises a resin and at least one composite fluorescent gold nanocluster 110 is poured into the recessed portion 1022 of the substrate 102 until the gallium nitride-based semiconductor 1042 is completely submerged therein, after curing, the slurry is solidified and forms a polymeric layer 1046 that encapsulates the gallium nitride-based semiconductor 1042 therein, thereby creates a light emitting unit 104. In some embodiments, the slurry is a mixture of resins, preferably light-curable resins; and a plurality of composite fluorescent gold nanoclusters 110. According to embodiments of the present disclosure, the composite fluorescent gold nanoclusters 110 are suspended in a macromolecular solution, then are mixed with the resin in a volume ratio from 1:1 to 1:32, preferably is 1:1. After curing the slurry, the plurality of composite fluorescent gold nanoclusters 110 are spread and dispersed in the resin, therefore forming a solidified polymeric layer 1046, as illustrated in FIG. 1A.

Examples of the light-curable resin include, but are not limited to, 1-hydroxycyclohexyl phenyl ketone; 2-benzyl-2-(dimethylamino)-4'-morpholinobutyrophenone; 2-hydroxy-2-methylpropiophenone (HMPP); 2,4,6-trimethylbenzoyl diphenylphosphine oxide (Lucirin® TPO); 50-50 Blend of HMPP and TPO; 2-methyl-4'-(methylthio)-2-morpholinopropiophenone (MMMP); 2,2-dimethoxy-2-phenyl acetophenone (BDK); or 1-hydroxy-2-butanone. In some embodiments of the present disclosure, the light-curable resin is HMPP.

The macromolecular solution is a gel or slurry phase formed by dissolving a polymer in a proper solvent (e.g., water, alcohols, and the like). Examples of polymers include, but is not limited to, poly(ethylene glycol) diacrylate (PEGDA); poly(ethylene glycol) dimethacrylate; polyvinylpyrrolidone (PVP), which generally refers to a polymer containing vinyl pyrrolidone (also referred to as N-vinylpyrrolidone, N-vinyl-2-pyrrolidione and N-vinyl-2-pyrrolidinone) as a monomeric unit; poly(N-isopropyl acrylamide); polyvinylalcohol (PVA); and polyepoxysuccinic acid (PESA) and its salt derivatives. In some embodiments, the macromolecular solution is a PEGDA solution (i.e., PEGDA in water).

Figure 1B:
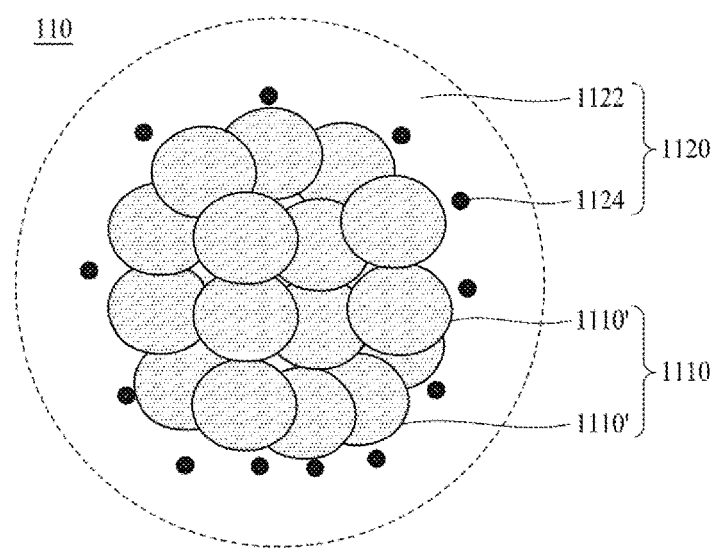
FIG. 1B is a schematic diagram illustrating a composite fluorescent gold nanocluster 110 in FIG. 1A.

Referring to FIG. 1B, which is a schematic view of a composite fluorescent gold nanocluster 110 according to one embodiment of the present disclosure. As illustrated, the composite fluorescent gold nanocluster 110 comprises a gold nanocluster 1110 and a capping layer 1120.

Specifically, the gold nanocluster 1110 is composed by multiple gold atoms 1110'. As could be appreciated, although the gold nanocluster 1110 in FIG. 1B is depicted to compose of a specific number of gold atoms 1110', yet embodiments of the present invention are not limited thereto; rather, the gold nanocluster 1110 may be an aggregation of any suitable number in the range of several to dozens of gold atoms 1110'. Preferably, the gold nanoclusters 1110 as described herein comprise 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 atoms. In other preferred embodiments, the gold nanoclusters 1110 comprise 2-30 atoms, 5-25 atoms, 5-20 atoms, or 5-15 atoms. Generally, the diameter of the gold nanocluster 1110 is about 0.1 to about 3 nm; preferably less than about 2 nm.

Still referring to FIG. 1B, the capping layer 1120 comprises a matrix 1122 made of a benzene-based compound; and a plurality of phosphine-based compounds 1124 distributed across the matrix 1122. As illustrated in FIG. 1B, the capping layer 1120 encapsulates the entire gold nanocluster 1110. In other alternative embodiments, the capping layer 1120 encapsulates or covers just a portion of the outer surface of the gold nanocluster 1110, or several portions of the outer surface of the gold nanocluster 1110.

According to one embodiment of the present disclosure, the composite fluorescent gold nanoclusters 110 of the present disclosure may be produced by various methods. Each methods preferably comprises at least the following steps: (a) mixing gold(III) chloride ($AuCl_3$) and a benzene-based compound at a molar ratio of about 1:0.5 to 1:5 to produce a first fluorescent gold nanoclusters; (b) treating the first fluorescent gold nanoclusters with an energy source selected from the group consisting of UV, acoustic, heat, microwave and a combination thereof to produce a second fluorescent gold nanoclusters; and (c) modifying the second fluorescent gold nanoclusters of the step (b) with a phosphine-based compound to produce the composite fluorescent gold nanoclusters of the present disclosure. It is worth noting that no reducing agent is required in this preferable method.

Examples of the benzene-based compound include, but are not limited to, benzene, alkylbenzene (such as, toluene, cumene, ethylbenzene, styrene, and xylene), halobenzene (e.g., fluorobenzene, chlorobenzene, bromobenzene, and iodobenzene), oxygen-containing benzene (e.g., phenol, benzoic acid, acetophenone, methyl benzoate, and anisole), nitrogen-containing benzene (e.g., aniline, nitrobenzene, benzonitrile, and benzamide), sulfur-containing benzene (e.g., benzenesulfonic acid), or polyaromatic (e.g., naphthalene, and anthracene). According to some examples, the benzene-based compound is toluene.

In addition, phosphine-based compound is known to person having ordinary skill in the art, suitable examples of phosphine-based compound include, but are not limited to, phosphine, phosphine oxide, phosphonium, diphosphine, triphosphine, alkyl phosphine, cycloalkyl phosphine, aryl phosphine, aryl phosphine oxide, phenyl phosphine, bidentate phosphine, silicone derivative of phosphine, siloxane or polysilane derivative of phosphine, and olefinic phosphine. In some examples, the phosphine-based compound is alkyl phosphine, such as trioctylphosphine (TOP). In other examples, the phosphine-based compound is aryl phosphine oxide such as trioctylphosphine oxide (TOPO). In still other examples, the phosphine-based compound is phenyl phosphine, such as triphenylphosphine (TPP).

According to the present disclosure, the light-emitting unit 104 of the LED package structure 100 is configured to emit lights with pre-determined wavelengths depending on doping materials contained therein. The composite fluorescent gold nanoclusters 110 are configured to emit a first light in a first wavelength, and to absorb at least a portion of the light emitted from the gallium nitride-based semiconductor 1042, and emits a second light in a second wavelength, in which the first and second wavelengths are different. Eventually, the un-absorbed light emitted from the gallium nitride-based semiconductors 1042 and the second light emitted by the composite fluorescent gold nanoclusters 110 would combine with each other to produce a desired light color (e.g., white light).

More specifically, according to certain embodiments of the present disclosure, the original wavelength of the composite fluorescent gold nanocluster 110 is between about 500 nm to about 590 nm, such as 500, 505, 510, 515, 520, 525, 530, 535, 540, 545, 550, 555, 560, 565, 570, 575, 580, 585, and 590 nm. As the converted wavelength of the second light after excited by the light-emitting unit 104, the converted wavelength of the peak emission is between about 550 nm to about 680 nm, such as 550, 555, 560, 565, 570, 575, 580, 585, 590, 595, 600, 605, 610, 615, 620, 625, 630, 635, 640, 645, 650, 655, 660, 665, 670, 675, and 680 nm. In some practical examples, the second peak emission is at about 550 nm to 600 nm. In other practical examples, the wavelength of the second peak emission is at about 600 to 675 nm (i.e., orange and/or red lights).

According to one embodiment of the present disclosure, in the LED package structure 100, the gallium nitride-based semiconductors 1042 of the light-emitted unit 104 is InGaN/GaN semiconductors that emits a light having a wavelength between 395 nm to 495 nm (a.k.a., a blue light). In such case, the composite fluorescent gold nanoclusters 110 convert the emission light from the original wavelength between 570 nm to 590 nm to a wavelength between 600 nm to 675 nm by absorbing the blue light emitted from the gallium nitride-based semiconductors 1042. Therefore, the LED package structure 100 eventually emits a white light as a result of color addition of the original blue light emitted from the gallium nitride-based semiconductors 1042, and the first light and the re-emitted second light respectively generated from the composite fluorescent gold nanoclusters 110 before and after wavelength conversion.

Figure 2:
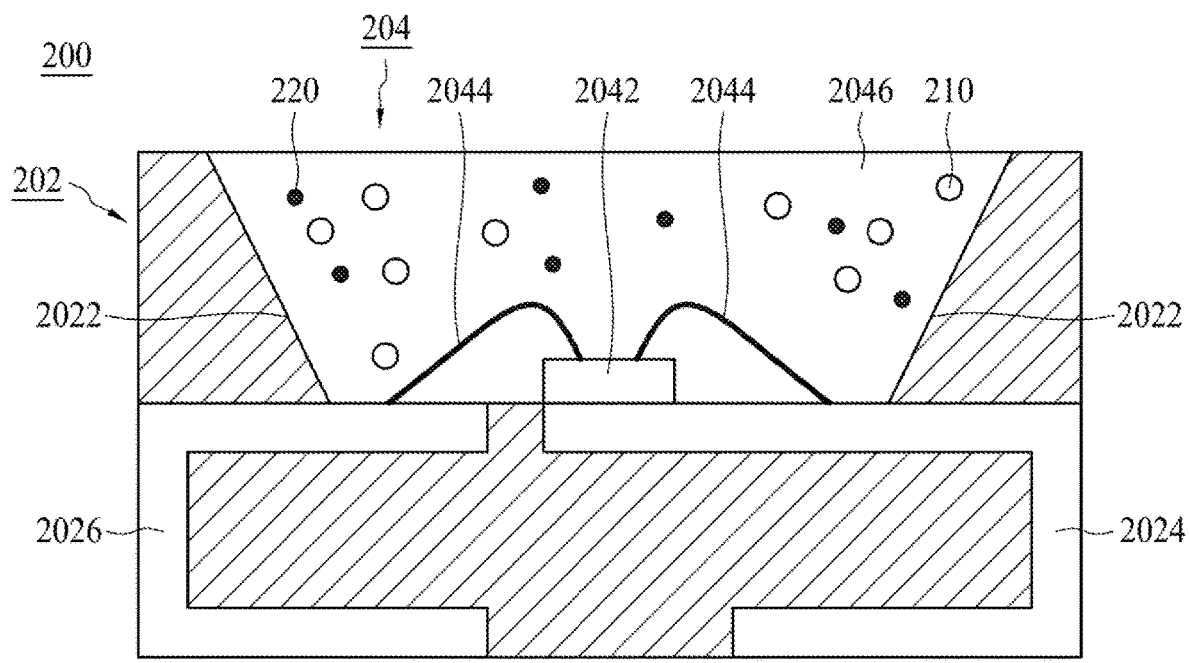
FIG. 2 is a cross-section view of an exemplary LED package structure 200 according to another embodiment of the present disclosure.

Referring to FIG. 2, which is a schematic drawing of an LED package structure 200 in according to another embodiment of the present disclosure. The LED package structure 200 emits a white light, and is characterized in having the composite fluorescent gold nanoclusters 210 as the wavelength-convertible materials. The configuration of the LED package structure 200 is similar to that of the LED package structure 100, and is constructed in similar manner except a GaN/AlGaN semiconductor emitting a wavelength shorter than 395 nm is used, and the polymeric layer encapsulating the GaN/AlGaN semiconductor further comprises a plurality of luminescent carbon nanoparticles 220 dispersed in the resin. As depicted, the LED package structure 200 comprise in its structure, a substrate 202; and a light emitting unit 204, which comprises a GaN/AlGaN semiconductor 2042 and a polymeric layer 2046 encapsulating the GaN/AlGaN semiconductor 2042. Similar to the process described above for constructing the LED package structure 100 of FIG. 1A, a positive metal terminal 2024 and a negative metal terminal 2026 respectively serving as the positive and negative electrodes are constructed on the substrate 202; then, the GaN/AlGaN semiconductor 2042 is disposed in a recessed portion 2022 of the substrate 202, and on top of the positive metal terminal 2024; the GaN/AlGaN semiconductor 2042 is electronically connected to the positive and negative metal terminals 2024, 2026 via two conductive wires 2044. A polymeric layer 2046 encapsulating the GaN/AlGaN semiconductor 2042 therein is formed in the recessed portion 2022 thereby creating the light emitting unit 204. The GaN/AlGaN semiconductor emits a wavelength shorter than 395 nm, preferably in the range from about 200 nm to 395 nm. In other words, the GaN/AlGaN semiconductor emits an ultraviolet (UV) light. In addition to the resin and the plurality of composite fluorescent gold nanoclusters 210, the polymeric layer 2046 in this embodiment further comprises a plurality of luminescent carbon nanoparticles 220 dispersed in the resin. In practice, the polymeric layer 2046 is formed by filling the recessed portion 2022 of the substrate 202 with a slurry mixture of light-curable resins, at least one composite fluorescent gold nanoclusters 210 and a plurality of luminescent carbon nanoparticles 220. In some embodiment, the composite fluorescent gold nanoclusters and the luminescent carbon nanoparticles are mixed in a volume ratio of 1:10 to 10:1, preferably, 1:1. After curing (e.g., by heat or by exposed to light), the slurry mixture is solidified into the polymeric layer 2046, with the composite fluorescent gold nanoclusters 210 and the luminescent carbon nanoparticles 220 dispersed in the resin, as illustrated in FIG. 2.

The luminescent carbon nanoparticles 220 can be commercially available or can be synthesized at the bench in accordance with any method known in the art. According to the present disclosure, the luminescent carbon nanoparticles 220 are exemplary produced from carbon sources such as a mixture of carboxylic acids and long-chain hydrocarbon alkenes but may be varied according to practical needs. In some embodiments of the present disclosure, the carboxylic acid is citric acid and the long-chain hydrocarbon alkene is octadecene. Generally, the diameter of the luminescent carbon nanoparticle 220 is about 0.1 to about 3 nm; preferably is about 2.5 to 2.8 nm.

More specifically, the GaN/AlGaN semiconductor emits a wavelength shorter than 395 nm; and the luminescent carbon nanoparticles 220 respectively emit a blue light having a wavelength ranging from 400 nm to 500 nm. As such, by absorbing a portion of UV light, the original emission wavelength of the composite fluorescent gold nanoclusters 210 is converted from about 500-590 nm to about 550 nm to 600 nm. By this configuration, the LED package structure 200 eventually emits a white light, which is the summation of blue light and yellow light respectively emitted from the plurality of luminescent carbon nanoparticles 220 and the composite fluorescent gold nanoclusters 210 dispersed in the polymeric layer 2046.

It should be noted that the LED package structures of the present disclosure provide improved light-emitting properties due to the composite fluorescent gold nanoclusters, which possess at least following advantages: (1) the surface modification with phosphine-based compounds for the composite fluorescent gold nanoclusters increase the solubility thereof in the macromolecular solution, allowing the composite fluorescent gold nanoclusters to disperse more uniformly in the slurry; (2) since the fluorescence intensity of the wavelength-convertible materials is stable, the present LED package structure has excellent white color rendering property; (3) the fluorescence intensity of the composite fluorescent gold nanoclusters also increases in a correlation with the level of concentration thereof because of modification with benzene-based and phosphine-based compounds; and (4) the present fluorescent gold nanocluster are biocompatible and free from any toxicity since the manufacturing process of which does not require the use of any reducing agent, thereby enhancing the safety usage of the present LED package structures.

The following Examples are provided to elucidate certain aspects of the present invention and to aid those of skilled in the art in practicing this invention. These Examples are in no way to be considered to limit the scope of the invention in any manner. Without further elaboration, it is believed that one skilled in the art can, based on the description herein, utilize the present invention to its fullest extent. All publications cited herein are hereby incorporated by reference in their entirety.

EXAMPLE

1. Manufacturing White LED Package Structure
1.1 Preparation of Composite Fluorescent Gold Nanoclusters In an oxygen-free and moisture-free glovebox, mixed gold (III) chloride ($AuCl_3$) with toluene in the amount of approximately 7.5 mg/mL. The mixture was shaken for about 5 minutes to facilitate mixing, then heated at 80° C. or 120° C. for 1 hour. Then, the mixture was centrifuged at 3,000 rpm for 5 minutes, the supernatant was collected and exposed to UV radiation for 24 hours. Next, the UV-radiated supernatant (containing $AuCl_3$ in a concentration of 1 mg/mL) was mixed with a toluene solution containing phosphine-based compound, e.g., TOP (200 mM), the thus produced composite fluorescent gold nanoclusters in toluene was stored as a stock until further use. For the sake of brevity, the composite fluorescent gold nanoclusters encompassing TOP is abbreviated as CFGN-TOPs hereinafter. In this experiment, the primary concentration of the CFGN-TOPs in the stock is defined as a stock concentration, which is denoted by 1-fold or 1×.

1.2 Preparation of Luminescent Carbon Nanoparticles

Citric acid (0.8 g) and glycine (0.2 g) were respectively added into a nitric acid solution (which was prepared by mixing 1 mL nitric acid (0.5M) with 1 mL $H_2O$), the mixture was then subjected to ultrasonic oscillation until all matters were completely dissolved. The thus produced solution was added into an oil solution (oleylamine (3 ml) and octadecene (7 ml)), and the mixture was ultrasonic oscillated for 15 seconds to form milky micelles, and continued to stir (at 700 rpm) for 10 minutes. The product was heated at 200° C. for 30 minutes in the presence of argon, then was centrifuged (3,000 rpm, 5 minutes) to remove carbon nanoparticles that were lower 1 nm in size. The remaining carbon nanoparticles were re-dissolved in acetone in a volume ratio of 1:3, then centrifuged at the speed of 13,300 rpm for 10 minutes. The carbon particles were harvested and re-suspended in toluene and stored as a stock. The thus produced concentration of the luminescent carbon nanoparticles is defined as a stock concentration, which is denoted by 1×.

1.3 Encapsulating the Blue Light-Emitting Chip with a Polymer Containing Composite Fluorescent Gold Nanoclusters Obtained from Example 1.1

The toluene solution contacting composite fluorescent gold nanoclusters (CFGN-TOPs) obtained from Example 1.1 were dried by an evaporator. The composite fluorescent gold nanoclusters were re-suspended in a slurry of light-curable resin (HMPP) and PEGDA polymer in a pre-determined concentration (i.e., 0.59× to 1×) or volume (i.e., 10-30 µL). The slurry was overlaid onto a substrate where a blue color light-emitting chip disposed, the slurry was cured for 60-90 seconds to form a solidified polymeric layer encapsulating the blue color light-emitting chip therein thereby producing the desired white light LED package structure.

1.4 Encapsulating the UV Light-Emitting Chip with a Polymer Containing the Composite Fluorescent Gold Nanoclusters of Example 1.1 and the Luminescent Carbon Nanoparticles of Example 1.2

The composite fluorescent gold nanoclusters of Example 1.1 and the luminescent carbon nanoparticles of Example 1.2 were mix in a volume ratio of 1:10 to 10:1 and were dried by an evaporator, then were re-suspended in a slurry of light-curable resin (HMPP) and PEGDA polymer in a determined concentration or volume (e.g., in a volume ratio of 1:1). The slurry was overlaid onto a substrate where a UV light-emitting chip was disposed, the slurry was cured for 60-90 seconds to form a solidified polymeric layer encapsulating the UV light-emitting chip therein thereby producing the desired white light LED package structure.

2. Characterization of the White Light LED Package Structure of Example 1

The function of the white light LED package structure (i.e., the light-emitting property) was evaluated by the degree of dispersion of composite fluorescent gold nanoclusters in macromolecular solution, the amount of phosphine-based compound in the composite fluorescent gold nanoclusters.

2.1 Dispersion Characteristics of Gold Nanoclusters in Macromolecular Solution

Figure 3:
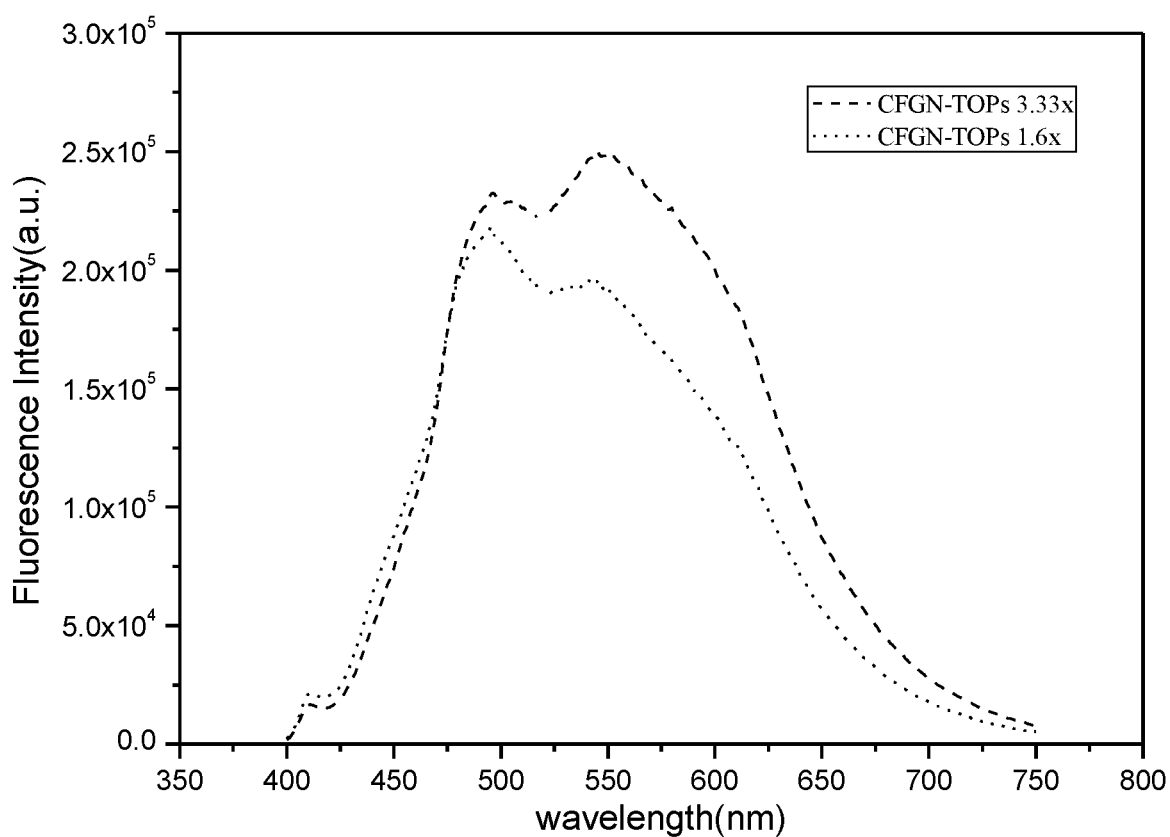
FIG. 3 provides a fluorescence spectrum of the composite fluorescent gold nanoclusters encapsulated in a macromolecular solution according to one example.

To verify the dispersibility, different condensed concentrations (1.6× and 3.33×) of the stock composite fluorescent gold nanoclusters in macromolecular solutions were mixed with PEGDA solution, and fluorescence intensity emitted therform was measured. It was found that the composite fluorescent gold nanoclusters distributed uniformly across the PEGDA film regardless concentrations thereof; in addition, when excited with a light of 350 nm, the peak emission of the CFGN-TOPs was found to be centralized at about 550-575 nm (FIG. 3). These results indicated that the dispersibility of the present composite fluorescent gold nanoclusters is high and desirable.

2.2 Light Performance of White LED Package Structure of Example 1.3 (CFGN-TOPs)

2.2.1 Light Emission Characteristics Vs. Composite Fluorescent Gold Nanoclusters Concentrations Different diluted concentrations (0.59×, 0.656×, 0.72×, 0.81×, and 1×) of the stock CFGN-TOPs were encapsulated within the blue color light-emitting chip in accordance with procedures described in Example 1.3. After encapsulation, the LED package structure was powered by 25 mA current and subjected to fluorescent intensity measurement using fluorescence photoluminescence spectrophotometer. Results are depicted in FIGS. 4A-4B.

Figure 4A:
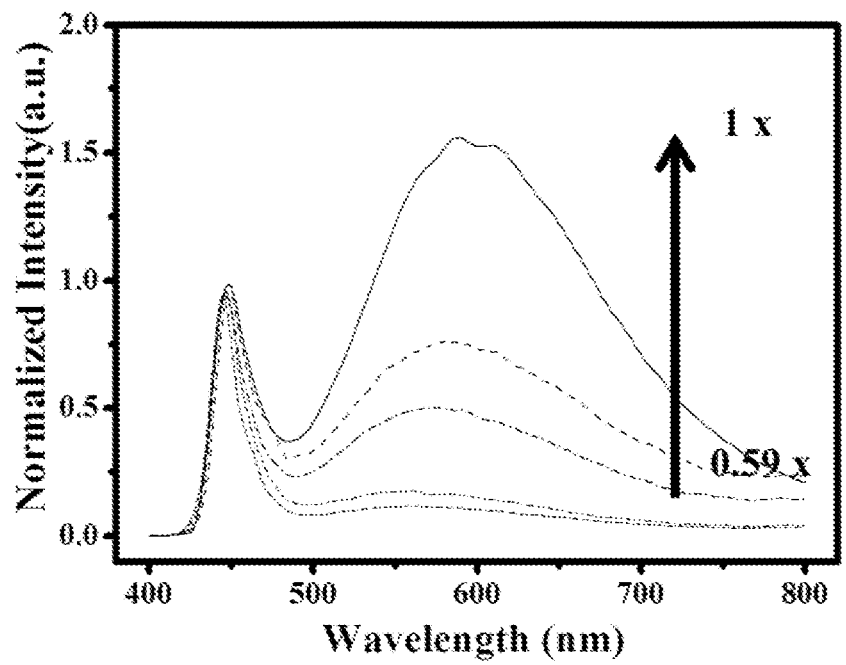
FIGS. 4A-4B respectively provide a fluorescence spectrum and the emission properties (CCT and light rendering) of the LED package structure according to one example.
Figure 4B:
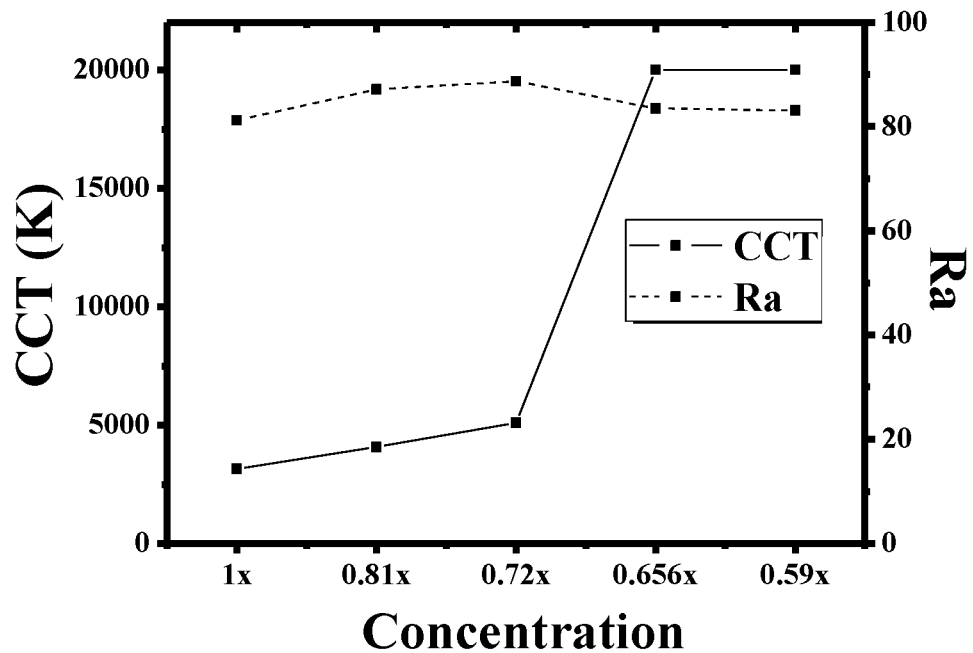

It appeared that the fluorescent intensity increased with an increase in the concentration of CFGN-TOPs (FIG. 4A). From a chromaticity diagram (CIE 1931 XYZ color spaces) result, the color emitted from the LED package structure shifted from blue color to white color, and eventually turned into yellow color. Further, the CCT of the light emitted by LED package structure decreased with an increase in the concentration of CFGN-TOPs. The CCT of the LED package structure was 5751K when the LED package structure emits a white light. On the other hand, the light rendering (Ra) of the LED package structure reached the peak of 92.71 Ra (FIG. 4B).

Figure 5A:
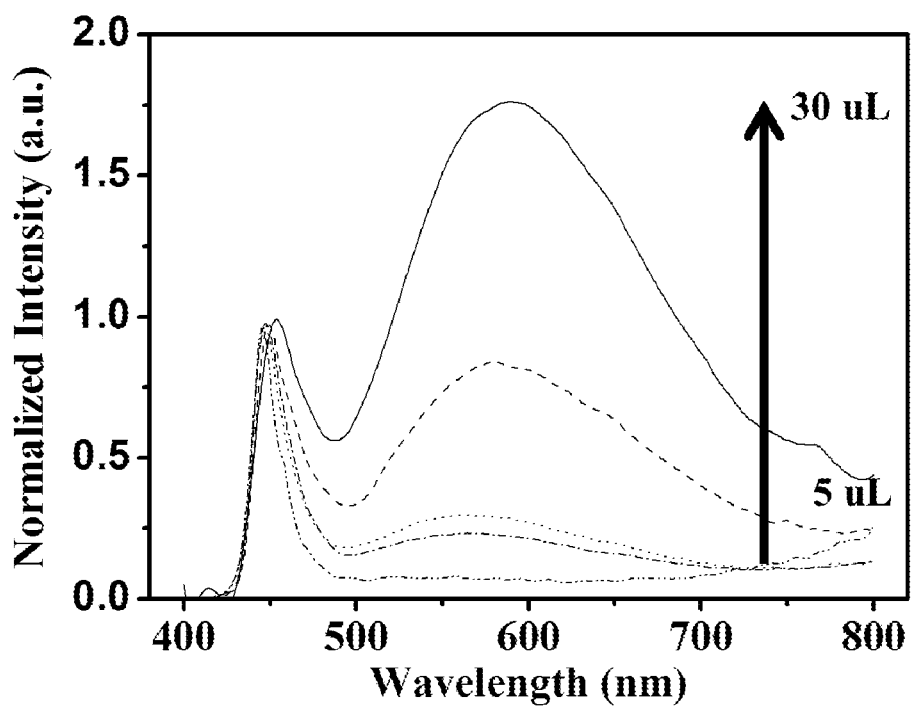
FIGS. 5A-5B respectively provide a fluorescence spectrum and the emission properties (CCT and light rendering) of the LED package structure according to one example.
Figure 5B:
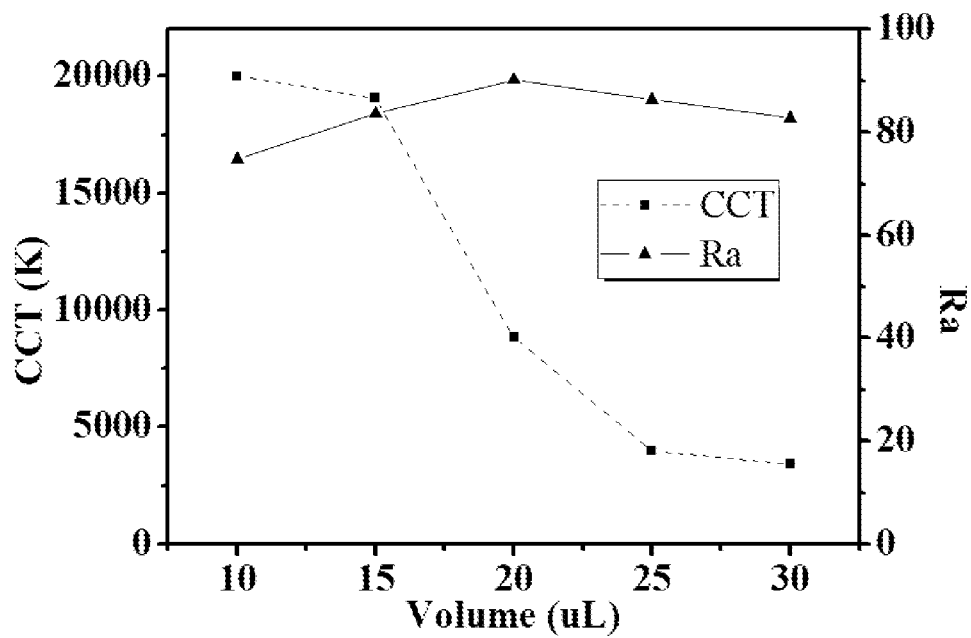

2.2.2 Light Emission Characteristics Vs. Composite Fluorescent Gold Nanoclusters Volumes Different volumes of the CFGN-TOPs (10-30 μl) were encapsulated within the blue color light-emitting chip in accordance with procedures described in Example 1.3. After encapsulation, the LED package structure was powered by 25 mA current and subjected to fluorescent intensity measurement using fluorescence photoluminescence spectrophotometer. Results are depicted in FIGS. 5A-5B. The emission profile of FIG. 5A indicated that the fluorescent intensity increased with an increase in the volume of CFGN-TOPs. As the CCT of the light emitted from LED package structure, it decreased with an increase in the volume of CFGN-TOPs. The CCT of the LED package structure was about 3993K when the LED package structure emitted a white light. On the other hand, the light rendering (Ra) of the LED package structure did not changed significantly with a change in the volume, and reached the highest performance at 90.17 Ra (FIG. 5B).

2.2.3 Light Emission Characteristics Vs. Electric Currents

Figure 6A:
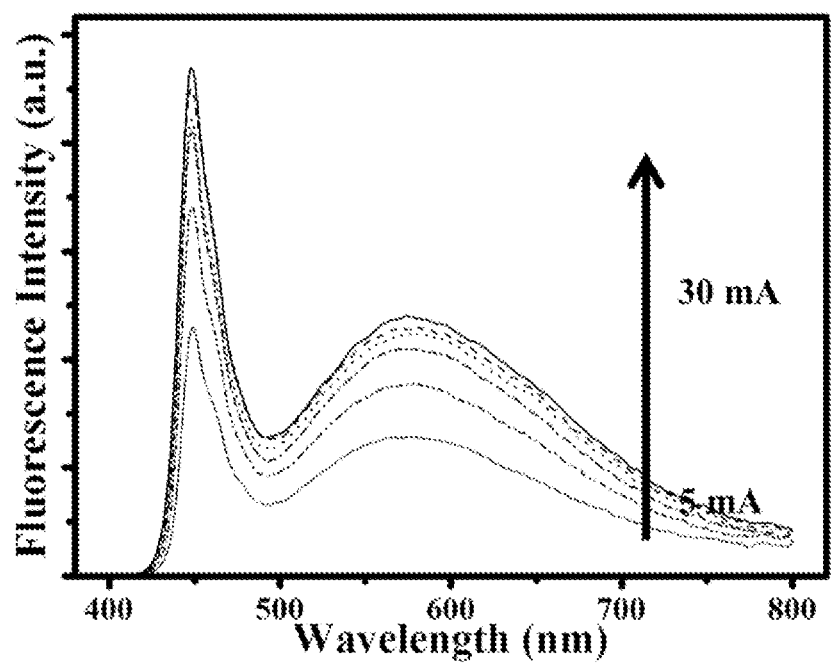
FIGS. 6A-6B respectively provide a fluorescence spectrum and the emission properties (CCT and light rendering) of the LED package structure according to one example.
Figure 6B:
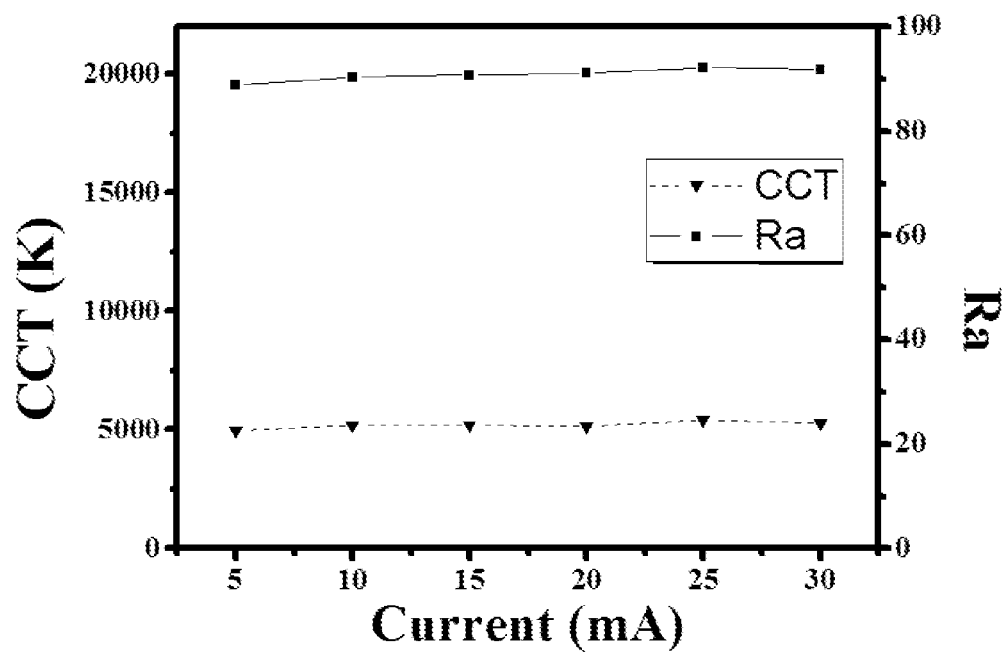

1× stock concentration of CFGN-TOPs (20 μl) were encapsulated within the blue color light-emitting chip in accordance with steps described in Example 1.3. After encapsulation, the LED package structure was powered by a current in the range of 5-30 mA and was subjected to fluorescent intensity measurement using fluorescence photoluminescence spectrophotometer. Results are depicted in FIGS. 6A-6B. The emission profile of FIG. 6A revealed that the fluorescent intensity increased with an increase in the current density, whereas the CCT of the light emitted from LED package structure and the light rendering (Ra) thereof remained relatively unchanged (FIG. 6B). CCT of the LED package structure was around 5200K, and the light rendering remained about 90.

2.3 Comparison of Light Performances Among LED Package Structures Respectively Comprising Phosphors and the Present Composite Fluorescent Gold Nanoclusters of Example 1.3

Figure 7:
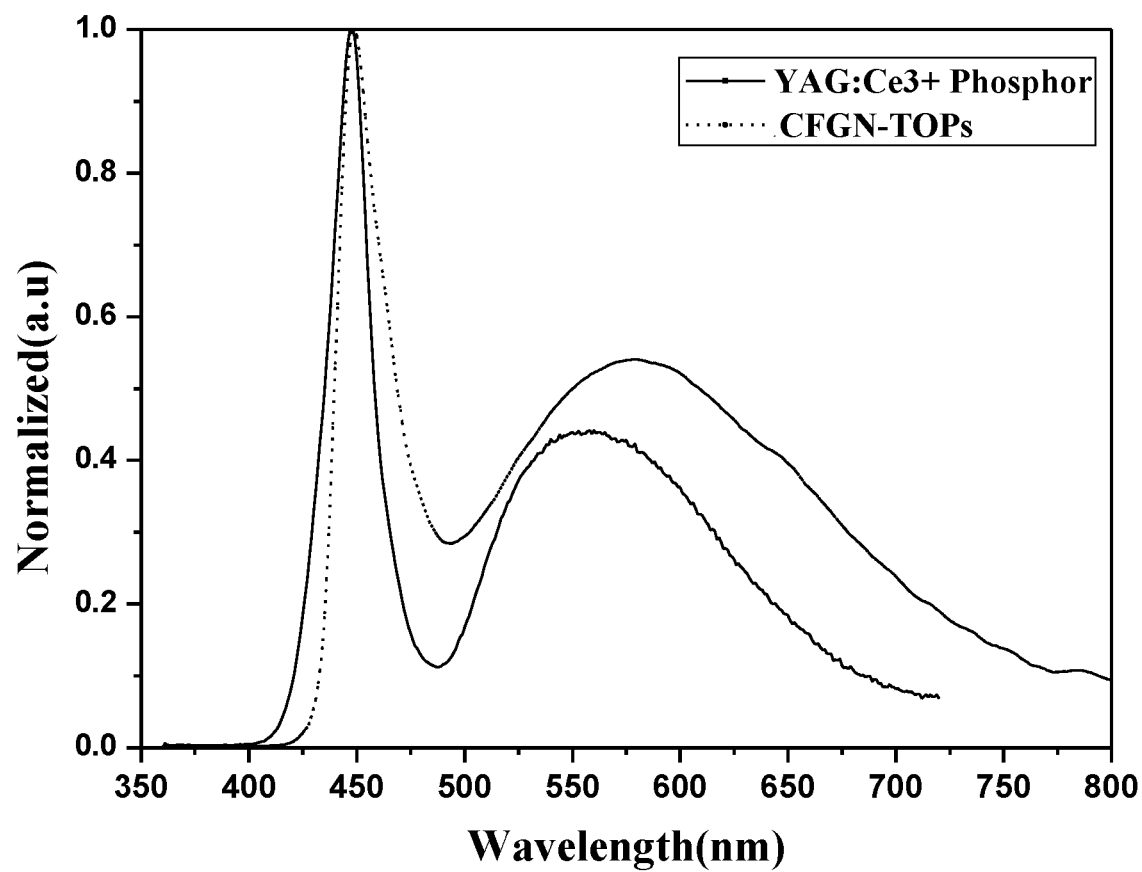
FIG. 7 is fluorescent spectra showing the comparison among the present LED package structures and the conventional one.

Light performance of the present white LED package structures (in which the wavelength-convertible material was CFGN-TOPs) was compared with that of a conventional LED package structure, in which the wavelength-convertible material was phosphor $Ce^{3+}$-doped $Y_3Al_5O_{12}$ (YAG:$Ce^{3+}$). The results are depicted in FIG. 7 and are summarized in Table 1. It was found that the fluorescent intensities emitted from the present wavelength-convertible materials are relatively stronger as compared with that of a LED package structure comprising phosphors. Further, the white LED package structures of the present disclosure possessed greater light rendering property (Ra) than that of a conventional LED package structure in which phosphor materials were used.

TABLE 1

Comparison between devices respectively comprising CFGN-TOPs and conventional YAG:$Ce^{3+}$

| LED package structures | Wavelength-convertible material | Chromaticity diagmm (CIE 1931 coordinates) | | CCT (K) | Ra |
|---|---|---|---|---|---|
| | | x-axis | y-axis | | |
| Conventional LED | YAG:$Ce^{3+}$ | 0.31207 | 0.30866 | 6728 | 77.1026 |
| Present LED | CFGN-TOPs | 0.3397 | 0.32548 | 5143 | 91.7027 |

Figure 8:
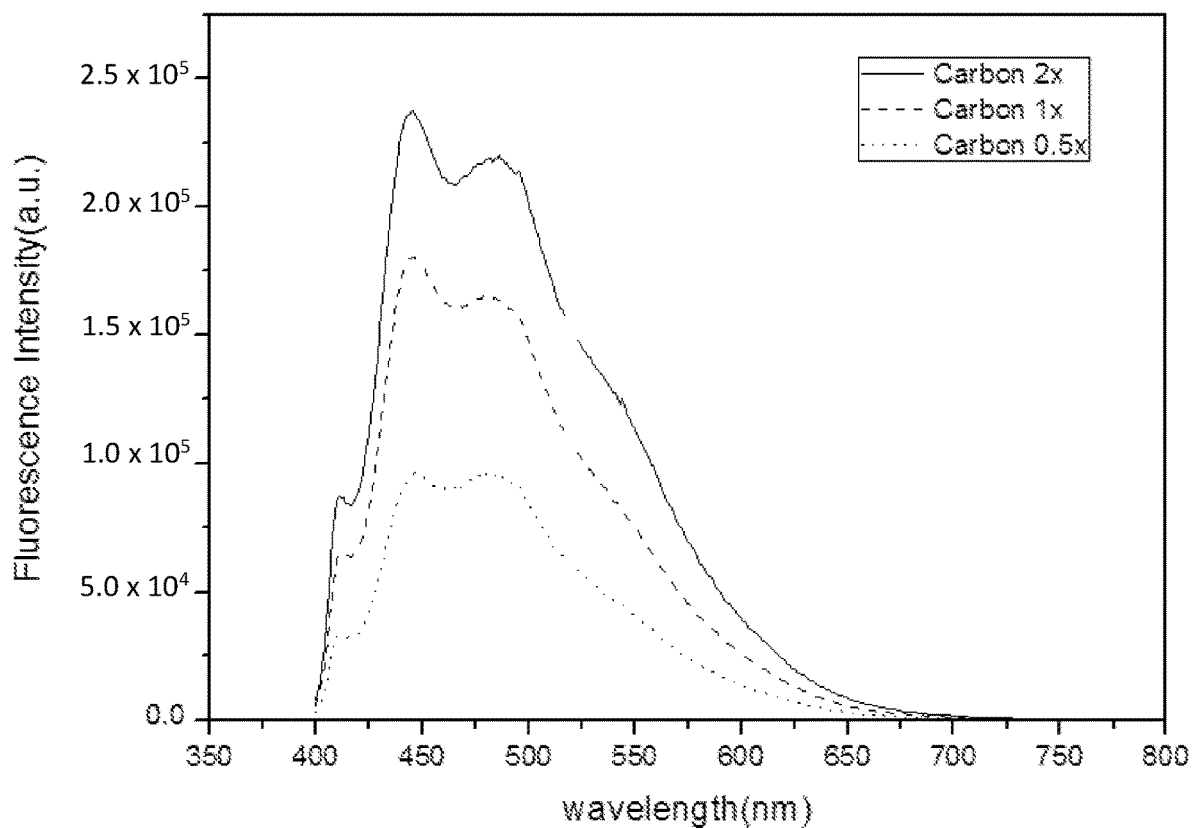
FIG. 8 provides a fluorescence spectrum of the luminescent carbon nanoparticles encapsulated in a macromolecular solution according to one example.

2.4 Dispersion Characteristics of Luminescent Carbon Nanoparticles in Macromolecular Solution Like Example 2.1, to verify the dispersibility, different concentrations (0.5×, 1× and 2×) of the stock luminescent carbon nanoparticles in macromolecular solutions were mixed with PEGDA solution, and fluorescence intensity emitted therefrom was measured. It can be observed that the luminescent carbon nanoparticles distribute uniformly across the PEGDA film regardless concentrations thereof; in addition, when emitted by a 350 nm wavelength, the peak emission of the luminescent carbon nanoparticles is centralized about 450 nm (FIG. 8). These results indicated that the uniformity of the distributed luminescent carbon nanoparticles is high and desirable.

2.5 Light Performance of White LED Package Structure of Example 1.4 (CFGN-TOP)

Figure 9:
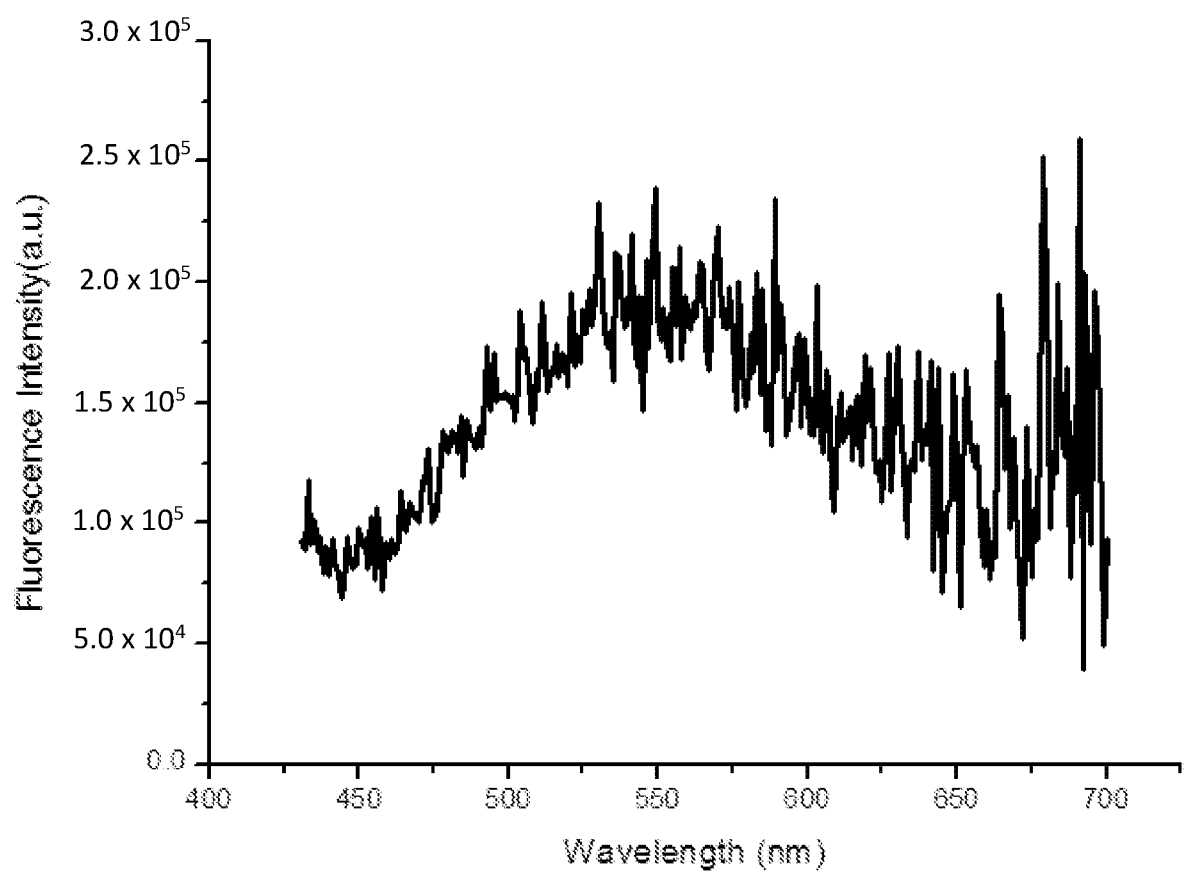
FIG. 9 provides a fluorescence spectrum of the LED package structure according to one example.

The CFGN-TOPs of Example 1.1 and the luminescent carbon nanoparticles obtained from Example 1.2 were mix in a ratio of 1:1 and were encapsulated within the UV light-emitting chip by the method of Example 1.4. After encapsulation, the LED package structure was powered by 25 mA current and subjected to fluorescent intensity measurement using fluorescence photoluminescence spectrophotometer. Results are depicted in FIG. 9. The emission profile of FIG. 9 represents the fluorescent emission was shifted and converted to visible spectrum, which eventually emitting as a white light.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:

1. A light-emitting diode (LED) package structure, comprising,
    a substrate; and
    a light-emitting unit disposed on the substrate, wherein the light-emitting unit comprises:
        a gallium nitride-based semiconductor configured to emit a light having a wavelength that is shorter than 395 nm; and
        a polymeric layer encapsulating the gallium nitride-based semiconductor, wherein the polymeric layer comprises a resin, at least one composite fluorescent gold nanocluster dispersed in the resin, and a plurality of luminescent carbon nanoparticles dispersed in the resin and respectively emitting a light of a wavelength ranging from 400 nm to 500 nm;
    wherein each composite fluorescent gold nanocluster comprises,
        a gold nanocluster; and
        a capping layer composed of a matrix made of a benzene-based compound, and a plurality of phosphine-based compounds distributed across the matrix,
        wherein the capping layer encapsulates at least a portion of an outer surface of the gold nanocluster.

2. The LED package structure of claim 1, wherein the benzene-based compound is selected from the group consisting of benzene, alkylbenzene, halobenzene, phenol, benzoic acid, acetophenone, methyl benzoate, anisole, aniline, nitrobenzene, benzonitrile, benzamide, benzenesulfonic acid, naphthalene, and anthracene.

3. The LED package structure of claim 2, wherein the alkylbenzene is toluene, cumene, ethylbenzene, styrene, or xylene; and the halobenzene is fluorobenzene, chlorobenzene, bromobenzene, or iodobenzene.

4. The LED package structure of claim 1, wherein the plurality of phosphine-based compounds is selected from the group consisting of phosphine, phosphine oxide, phosphonium, diphosphine, triphosphine, alkyl phosphine, cycloalkyl phosphine, aryl phosphine, aryl phosphine oxide, phenyl phosphine, bidentate phosphine, silicone derivative of phosphine, siloxane or polysilane derivative of phosphine, and olefinic phosphine.

5. The LED package structure of claim 4, wherein the alkyl phosphine is trioctylphosphine (TOP); the aryl phosphine oxide is trioctylphosphine oxide (TOPO); and the phenyl phosphine is triphenylphosphine (TPP).

6. A method of producing the LED package structure, comprising,
    (a) providing a substrate;
    (b) electrically connecting a gallium nitride-based semiconductor onto the substrate, in which the gallium nitride-based semiconductor is configured to emit a light having a wavelength that is shorter than 395 nm;
    (c) overlaying the gallium nitride-based semiconductor with a slurry comprising a resin, a plurality of composite fluorescent gold nanoclusters, and a plurality of luminescent carbon nanoparticles dispersed in the resin and respectively emitting a light of a wavelength ranging from 400 nm to 500 nm; and
    (d) curing the slurry overlaid on the gallium nitride-based semiconductor for a sufficient time to form a solidified polymeric layer, wherein the plurality of composite fluorescent gold nanoclusters are dispersed in the resin, wherein each composite fluorescent gold nanocluster comprises,
        a gold nanocluster; and
        a capping layer composed of a matrix made of a benzene-based compound, and a plurality of phosphine-based compounds distributed across the matrix,
        wherein the capping layer encapsulates at least a portion of an outer surface of the gold nanocluster.

7. The method of claim 6, wherein the benzene-based compound is selected from the group consisting of benzene, alkylbenzene, halobenzene, phenol, benzoic acid, acetophenone, methyl benzoate, anisole, aniline, nitrobenzene, benzonitrile, benzamide, benzenesulfonic acid, naphthalene, and anthracene.

8. The method of claim 6, wherein the alkylbenzene is toluene, cumene, ethylbenzene, styrene, or xylene; and the halobenzene is fluorobenzene, chlorobenzene, bromobenzene, or iodobenzene.

9. The method of claim 6, wherein the plurality of phosphine-based compounds is selected from the group consisting of phosphine, phosphine oxide, phosphonium, diphosphine, triphosphine, alkyl phosphine, cycloalkyl phosphine, aryl phosphine, aryl phosphine oxide, phenyl phosphine, bidentate phosphine, silicone derivative of phosphine, siloxane or polysilane derivative of phosphine, and olefinic phosphine.

10. The method of claim 9, wherein the alkyl phosphine is trioctylphosphine (TOP); the aryl phosphine oxide is trioctylphosphine oxide (TOPO); and the phenyl phosphine is triphenylphosphine (TPP).

* * * * *